(12) United States Patent
Hayashi et al.

(10) Patent No.: US 7,115,533 B2
(45) Date of Patent: Oct. 3, 2006

(54) SEMICONDUCTOR DEVICE MANUFACTURING METHOD

(75) Inventors: Shigenori Hayashi, Nara (JP); Kazuhiko Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 198 days.

(21) Appl. No.: 10/319,654

(22) Filed: Dec. 16, 2002

(65) Prior Publication Data

US 2003/0113972 A1 Jun. 19, 2003

(30) Foreign Application Priority Data

Dec. 18, 2001 (JP) ............. 2001-384344

(51) Int. Cl.
*H01L 21/31* (2006.01)
(52) U.S. Cl. ............. 438/785; 257/E21.091
(58) Field of Classification Search .......... 438/204, 438/287, 597, 785, FOR. 202, 297; 257/E21.091, 257/E21.169, E21.462, E21.006, E21.272; 204/192.11, 192.12, 192.15, 192.22, 289.04; 505/475, 476, 731, 816; 219/121.15
See application file for complete search history.

(56) References Cited

U.S. PATENT DOCUMENTS

| | | | | |
|---|---|---|---|---|
| 4,937,094 A | * | 6/1990 | Doehler et al. | 427/574 |
| 5,937,303 A | * | 8/1999 | Gardner et al. | 438/305 |
| 6,020,024 A | * | 2/2000 | Maiti et al. | 427/248.1 |
| 6,146,742 A | * | 11/2000 | Hsieh et al. | 428/209 |
| 6,291,866 B1 | * | 9/2001 | Wallace et al. | 257/410 |
| 6,346,174 B1 | * | 2/2002 | Finley et al. | 204/192.15 |
| 6,420,742 B1 | * | 7/2002 | Ahn et al. | 257/295 |
| 6,602,753 B1 | * | 8/2003 | Koyama et al. | 438/287 |
| 6,710,383 B1 | * | 3/2004 | Yugami et al. | 257/288 |
| 2004/0157473 A1 | * | 8/2004 | Hayashi et al. | 438/785 |

FOREIGN PATENT DOCUMENTS

| | | |
|---|---|---|
| JP | 54-015668 A | 2/1979 |
| JP | 56-147470 A | 11/1981 |
| JP | 58-154258 A | 9/1983 |
| JP | 59-112627 A | 6/1984 |
| JP | 59-114863 A | 7/1984 |
| JP | 59-119734 A | 7/1984 |
| JP | 59-188957 A | 10/1984 |
| JP | 60-050950 A | 3/1985 |
| JP | 63-259070 A | 10/1988 |
| JP | 1-154547 A | 6/1989 |
| JP | 04-242969 A | 8/1992 |
| JP | 06-101019 A | 4/1994 |
| JP | 11-168096 A | 6/1999 |
| JP | 2001-210636 A | 8/2001 |
| JP | 2001-237424 A | 8/2001 |
| JP | 2002-151502 A | 5/2002 |
| JP | P2002-184773 A | 6/2002 |

OTHER PUBLICATIONS

Wolf et al. (Silicon Processing For The VLSI Era, vol. I: Process Technology, p. 331-p. 381, 1986).*
Takeshi Yamaguchi et al., Study on Zr-Silicate Interfacial Layer of $ZrO_2$-MIS Structure Fabricated by Pulsed Laser Ablation Deposition Solid State Devices and Materials, pp. 228-229, Sendai, 2000.

* cited by examiner

*Primary Examiner*—Brook Kebede
(74) *Attorney, Agent, or Firm*—McDermott Will & Emery LLP

(57) ABSTRACT

The present invention provides a method of depositing a metal film on a substrate in a non-oxidizing atmosphere and then forming a metal oxide film by oxidizing the metal film in an oxidizing atmosphere.

29 Claims, 10 Drawing Sheets

FIG. 5

| | Case A | Case B | Case C | Case D |
|---|---|---|---|---|
| deposited film thickness | metal oxide layer: 1.3nm<br>metal layer: 0nm | metal oxide layer: 1.3nm<br>metal layer: 1.3nm | metal oxide layer: 1.3nm<br>metal layer: 2.6nm | metal oxide layer: 1.3nm<br>metal layer: 3.9nm |
| transmission electron microscope image (high-k layer / interface layer / silicon substrate) | | | | |
| physical film thickness | high-k layer: 1.6nm<br>interface layer: 2.8nm | high-k layer: 3.9nm<br>interface layer: 1.7nm | high-k layer: 5.7nm<br>interface layer: 0.8nm | high-k layer: 7nm<br>interface layer: 0.5nm |

SEMICONDUCTOR DEVICE MANUFACTURING METHOD

BACKGROUND OF THE INVENTION

The present invention relates to methods of manufacturing semiconductor devices having a gate insulating film made of a high dielectric constant material.

In recent years, advances have been made in reducing the size of MOSFETs (metal oxide semiconductor field effect transistors) that use silicon dioxide ($SiO_2$: relative dielectric constant $\epsilon=3.9$) or the like as the gate insulating film. As the size of the MOSFET is made progressively smaller, however, the capacitance (in other words, the gate insulating film capacitance) of the MOSFET drops, and as a result, the MOSFET no longer operates. Consequently, one solution that has been proposed for keeping the capacitance of the MOSFET from dropping is to reduce the film thickness of the gate insulating film of the MOSFET. However, if silicon dioxide is used as the gate insulating film, then reducing the thickness of the gate insulating film leads to the problem of increased gate leak current caused by tunneling current, and the MOSFET loses its ability to function as a transistor. As a result, it becomes difficult to further reduce the thickness of the gate insulating film. In other words, it is necessary that the film thickness of the gate insulating film of a MOSFET is kept above a certain level in order to prevent the capacitance of the MOSFET from dropping.

However, maintaining the film thickness of the gate insulating film above a certain level does not solve the problem of a drop in the capacitance of the MOSFET. Accordingly, another conceivable method for solving this problem is the use of a high-dielectric constant material (metal oxide) such as hafnium oxide ($HfO_2$: relative dielectric constant $\epsilon$=approximately 30) or zirconium oxide ($ZrO_2$: relative dielectric constant $\epsilon$=approximately 25) as the material for the gate insulating film. Using a metal oxide that has a high dielectric constant for the gate insulating film allows the physical film thickness to be increased while achieving a thin EOT (equivalent oxide ($SiO_2$) thickness). To date, gate insulating films employing $ZrO_2$, for example, have been disclosed (T. Yamaguchi et al., Study on Zr-Silicate Interfacial Layer of $ZrO_2$-MIS Structure Fabricated by Pulsed Laser Ablation Deposition Method, Extended Abstracts of the 2000 International Conference on Solid State Devices and Materials, Sendai, Japan, August 2000, pg 228 to 229).

FIG. 11 is a cross-sectional view showing a conventional semiconductor device manufacturing method. More specifically, it shows is a method of forming a metal oxide film as the gate insulating film. Here, a device capable of performing sputtering is employed as the film deposition system. As shown in FIG. 11, a substrate 1 made of silicon is placed inside a chamber (not shown) of the film deposition system. Hafnium (Hf) metal is employed as the target 11. Also, a gas mixture 12 including argon (Ar) gas and oxygen ($O_2$) gas is filled into the chamber. When a voltage is applied inside the chamber filled with the gas mixture 12, an electrical discharge occurs within the chamber, and this results in the formation of a metal oxide film 2 on the silicon substrate 1 due to reactive sputtering. If Hf metal is employed as the target 11, then the metal oxide film 2 that is formed directly on the silicon substrate 1 is theoretically a hafnium oxide film ($HfO_2$). By controlling the sputtering time, an $HfO_2$ thin film of about 3 to 10 nm thickness can be obtained as the metal oxide film 2.

However, in conventional methods for forming metal oxide films, the silicon substrate 1 and the metal oxide film 2, that is, the $HfO_2$ film, are exposed to an atmosphere that includes oxygen gas (the gas mixture 12 in FIG. 11). Consequently, as shown in FIG. 12, in practice, silicon diffuses from the silicon substrate 1 into the $HfO_2$ film and oxygen diffuses from the gas mixture into the $HfO_2$ film and the silicon substrate 1. As a result, as illustrated in FIG. 13, an interface layer 3 is formed between the silicon substrate 1 and the metal oxide film 2 made of the $HfO_2$ film. This interface layer 3 is conceivably a silicon-rich silicate ($Si_xM_yO_2$, where M is a metal (Hf in the case of FIG. 13) and $x+y=1$ ($x>0$, $y>0$)).

In other words, in conventional methods of forming metal oxide films, two layers, that is, a low-dielectric constant interface layer 3 and a high-dielectric constant $HfO_2$ thin film (metal oxide film 2), are formed on the silicon substrate 1. This means that a capacitor with a low capacitance and a capacitor with a high capacitance are connected in series, and the overall capacitance of the transistor is dictated by the capacitance of the capacitor with the lower capacitance. Consequently, even if attempts are made to increase the capacitance by using a material that has a high dielectric constant, if an interface layer is formed on the substrate, then the capacitance of the entire transistor (that is, the entire gate insulating film including the interface layer) drops, and as a result, MOSFET performance cannot be increased.

SUMMARY OF THE INVENTION

In light of the foregoing, it is an object of the present invention to prevent the formation of an interface layer with a low dielectric constant, such as a silicon-rich silicate layer, between the substrate and the high-dielectric constant layer (high-k layer) when forming a gate insulating film made of a high-dielectric constant material, while forming a gate insulating film made of only a high-dielectric constant material, and thereby to improve MOSFET performance.

To achieve the foregoing object, a semiconductor device manufacturing method according to the present invention includes a first step of depositing a metal film on a substrate in a non-oxidizing atmosphere and a second step of forming a metal oxide film by oxidizing the metal film in an oxidizing atmosphere.

According to the semiconductor device manufacturing method of the present invention, after a metal film is deposited on a substrate in a non-oxidizing atmosphere, a metal oxide film is formed by oxidizing the metal film in an oxidizing atmosphere. Thus, a metal oxide film can be formed without directly exposing the substrate to an oxidizing atmosphere, and thus oxidization of the substrate can be prevented. As a result, an interface layer with a low dielectric constant is not formed between the substrate and the metal oxide film. Consequently, a gate insulating film made of only the metal oxide film, that is, a high-dielectric constant material, can be formed, and therefore a drop in the overall capacitance of the transistor can be prevented even if the transistor is made small in size, so that the performance of the MOSFET can be increased.

In the semiconductor device manufacturing method of the present invention, it is preferable that the metal oxide film is a gate insulating film of a transistor.

Thus, a gate insulating film made of only a metal oxide film, which is a material with a high dielectric constant, can be formed on the substrate without the formation of an interface layer. Accordingly, the transistor can be formed without lowering the overall capacitance of the transistor, and thus MOSFET performance is increased.

In the semiconductor device manufacturing method of the present invention, it is preferable that the first step includes a step of depositing the metal film on the substrate through sputtering using a metal target while the inside of a chamber into which the substrate has been placed is turned into a non-oxidizing atmosphere.

Thus, a metal film can be formed while the formation of an interface layer is reliably inhibited. It should be noted that the chamber used in the first step and the chamber used in the second step can be the same chamber or can be different chambers. Also, in the first step, a metal oxide target or a metal nitride target can be substituted for the metal target.

In the semiconductor device manufacturing method of the present invention, the non-oxidizing atmosphere in the first step is an atmosphere in which oxidation of the substrate does not occur. That is, an atmosphere in which oxidation of the substrate does not occur (that is, an atmosphere in which an interface layer is not formed on the substrate), even if the atmosphere includes a small amount of oxygen, is regarded as a non-oxidizing atmosphere throughout this specification.

In the semiconductor device manufacturing method of the present invention, it is preferable that the partial pressure of oxygen in the non-oxidizing atmosphere in the first step is not more than $1.33 \times 10^{-2}$ Pa.

Thus, the risk that oxidation of the substrate will occur is reliably reduced.

In the semiconductor device manufacturing method of the present invention, it is preferable that the non-oxidizing atmosphere in the first step includes at least one of helium, neon, argon, krypton, xenon, radon, and nitrogen.

Thus, the risk that oxidation of the substrate will occur is reliably reduced, so that the formation of an interface layer on the substrate can be reliably prevented.

In the semiconductor device manufacturing method of the present invention, it is preferable that the metal film includes at least one of hafnium, zirconium, titanium, tantalum, aluminum, and a lanthanoid.

Thus, the dielectric constant of the metal oxide film that is formed by oxidation of the metal film is increased, so that by employing the metal oxide film as the gate insulating film, a drop in the capacitance of the gate insulating film can be prevented, even if the transistor is made small in size. Accordingly, MOSFET performance can be increased.

In the semiconductor device manufacturing method of the present invention, a metal nitride film or a metal oxide film can be deposited in place of the metal film in the first step.

More specifically, a metal nitride can be used in place of the metal film as the material that is sputtered onto the substrate. In this case, a metal nitride film is formed on the substrate, after which the metal nitride film is oxidized, so that the substrate is not directly exposed to an oxidizing atmosphere. Also, the nitrogen atoms included in the metal nitride film and the silicon atoms at the uppermost surface of the substrate bond to form SiN. Thus, there is the effect that the silicon atoms in the substrate are prevented from diffusing and bonding with the oxygen, that is, an interface layer is prevented from forming.

Additionally, as the material that is sputtered onto the substrate, a metal oxide can be used in place of metal if in a non-oxidizing atmosphere. In this case also, a metal oxide film can be deposited on the substrate without directly exposing the substrate to an oxidizing atmosphere, and thus the formation of an interface layer between the substrate and the metal oxide film can be prevented.

In the semiconductor device manufacturing method of the present invention, it is preferable that, if a metal nitride film is deposited in place of the metal film in the first step, then the metal nitride film includes at least one of hafnium nitride, zirconium nitride, titanium nitride, tantalum nitride, aluminum nitride, and a lanthanoid nitride. Thus, a metal oxide nitride film with a high dielectric constant can be formed while direct exposure of the substrate to an oxidizing atmosphere is prevented.

In the semiconductor device manufacturing method of the present invention, it is preferable that, if a metal oxide film is deposited in place of the metal film in the first step, then the metal oxide film includes at least one of hafnium oxide, zirconium oxide, titanium oxide, tantalum oxide, aluminum oxide, and a lanthanoid oxide. Thus, a metal oxide film with a high dielectric constant can be formed while oxidation of the substrate is prevented.

In the semiconductor device manufacturing method of the present invention, it is preferable that the first step includes a step of maintaining the temperature of the substrate at not less than 0° C. and not more than 300° C. That is, by lowering the substrate temperature during the first step, the risk that the substrate will be oxidized can be even further reduced.

In the semiconductor device manufacturing method of the present invention, it is preferable that the first step includes a step of propelling metal particles making up the metal film toward the substrate by setting an energy per particle at not less than 0.05 eV and not more than 1 eV.

Thus, the metal particles can be prevented from infiltrating into the substrate and forming silicide, and moreover this silicide can be prevented from being oxidized and forming an interface layer made of a silicate with a low dielectric constant.

It should be noted that in the semiconductor device manufacturing method of the present invention, the second step is performed in an oxidizing atmosphere, and in this specification, "oxidizing atmosphere" is used to mean an atmosphere in which oxidation of the substrate occurs. The oxidizing atmosphere can be made of atomic oxygen, molecular oxygen, or oxygen ions, for example, and there are no particular limitations regarding the oxidizing species included in the oxidizing atmosphere as long as the oxidizing species causes oxidation of the substrate. For example, the oxidizing atmosphere in the second step can include oxygen that has been turned into a plasma or oxygen that has been excited by light. However, it is necessary that control is performed corresponding to the type of oxidizing species included in the oxidizing atmosphere. For example, if the oxidizing species includes oxygen ions, then implantation into the substrate is possible even in low temperatures, and thus the depth of implantation in the substrate can be controlled. At this time, it is desirable that the thickness of the metal film on the substrate is substantially equal to the range of implantation of the oxygen ions. Thus, the formation of an interface layer caused by the supply of oxygen to the substrate can be inhibited.

In the semiconductor device manufacturing method of the present invention, it is preferable that the second step includes a step of maintaining the temperature of the substrate at not less than 0° C. and not more than 300° C. That is, by lowering the substrate temperature during the second step, the risk that oxidation of the substrate will occur can be reduced even further.

In the semiconductor device manufacturing method of the present invention, it is preferable that the first step and the second step are repeated in alternation, thereby forming a metal oxide film having a desired thickness to serve as a gate insulating film.

In the semiconductor device manufacturing method of the present invention, it is preferable that a third step of heating the substrate is further provided after the second step.

Thus, the oxygen concentration distribution in the metal oxide film can be made uniform. To describe this point in greater detail, the oxygen concentration distribution in the metal oxide film is not uniform at the point that the metal film is oxidized and changed to a metal oxide film in the second step. More specifically, although there is a high oxygen concentration in the surface side of the metal oxide film, which is supplied with oxygen atoms, the oxygen concentration in the metal oxide film at portions near the substrate (side opposite the surface) is low. However, by carrying out a third step of heating the substrate following the second step, the oxygen concentration distribution in the metal oxide film can be made uniform.

Additionally, if the third step is provided, then it is preferable that the third step is carried out in a non-oxidizing atmosphere. Thus, oxidation of the substrate can be prevented. Here, the non-oxidizing atmosphere in the third step can be made of an inert gas, or the non-oxidizing atmosphere can be a vacuum.

Further, if the third step is provided, then it is preferable that the third step includes a step of maintaining the temperature of the substrate at not less than 0° C. and not more than 600° C. Thus, oxidation of the substrate can be prevented. In addition, the metal oxide film can be maintained in an amorphous state, and columnar structures can be kept from occurring in the cross section structure of the metal oxide film.

In the semiconductor device manufacturing method of the present invention, it is preferable that, before the first step, a step of subjecting the substrate to nitrogen processing is further provided.

Thus, the silicon atoms at the uppermost surface portion of the substrate and the nitrogen atoms bond to form SiN, so that the silicon atoms can be prevented from diffusing and bonding with oxygen, that is, the formation of an interface layer can be prevented.

In the semiconductor device manufacturing method of the present invention, a step in which the metal oxide film is subject to dry etching or wet etching can be further provided after the second step. Thus, even if the film thickness of the metal oxide film that is formed through oxidation of the metal film is greater than the film thickness of the gate insulating film to be formed, the film thickness of the metal oxide film can be reduced down to a desired film thickness (film thickness of the gate insulating film to be formed). At this time, it is preferable that the dry etching is performed using a gas containing chlorine, a gas containing fluorine, or a gas containing another halogen. Consequently, the metal oxide film can be reliably etched. Also, in this case, the gas containing chlorine can include at least one of chlorine atoms and chlorine ions.

BRIEF DESCRIPTION OF THE DRAWINGS

FIG. 5 shows the transmission electron microscope image of the silicon substrate and the physical film thickness of the high-k layer and the interface layer after a metal oxide film made of $HfO_2$ having a constant thickness is deposited on an Hf metal layer that has been deposited on a silicon substrate at varying thicknesses in the case of a modified example of the semiconductor device manufacturing method according to Embodiment 1 of the present invention.

DETAILED DESCRIPTION OF THE INVENTION

EMBODIMENT 1

Hereinafter, a case in which an n-type MOSFET is formed is described with reference to the drawings as an example of the semiconductor device manufacturing method according to Embodiment 1 of the present invention.

FIGS. 1A to 1D are cross-sectional views showing the steps of the semiconductor device manufacturing method according to Embodiment 1.

Figure 1A:
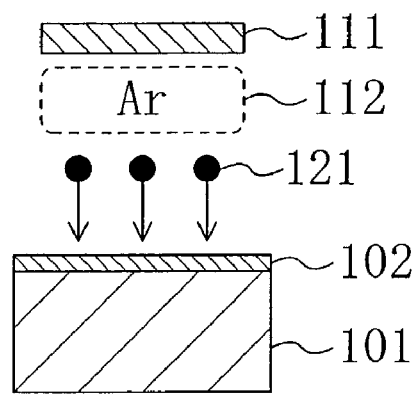
FIGS. 1A to 1D are cross-sectional views showing the steps of the semiconductor device manufacturing method according to Embodiment 1 of the present invention.

First, as shown in FIG. 1A, a substrate 101 made of silicon is placed in a chamber (not shown) and a target 111 made of Hf metal, for example, is arranged in the chamber, after which Ar gas 112 is introduced into the chamber. Thus, the inside of the chamber is a non-oxidizing atmosphere. Then, voltage is applied within the chamber to cause electrical discharge. As a consequence, Hf atoms 121 from the target 111 made of Hf metal fly toward the substrate 101 due to the sputtering effect, and as a result, a metal film 102 made of Hf metal is deposited on the substrate 101.

Figure 1B:
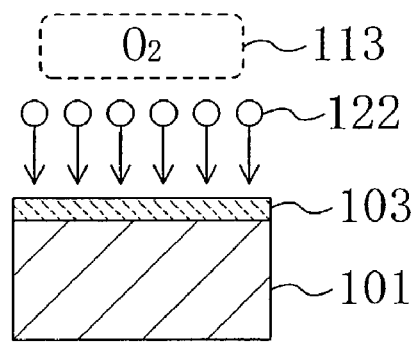

Next, as shown in FIG. 1B, by oxidizing the metal film 102 in an oxidizing atmosphere, a metal oxide film 103 made of $HfO_2$ is formed. More specifically, the substrate 101 onto which the metal film 102 has been deposited is introduced into the plasma processing chamber of a plasma processing system (not shown) and placed on a lower electrode (not shown). Then, $O_2$ gas 113 is introduced into the plasma processing chamber, after which RF power is applied to the RF electrode (not shown) of the plasma processing system so as to create a plasma made of the $O_2$ gas 113. Accordingly, the inside of the chamber becomes an oxidizing atmosphere. Then, when power is applied to the lower electrode onto which the substrate 101 has been placed, oxidizing species 122 of oxygen atoms including radicals and oxygen ions, for example, flies toward the metal oxide film 102. Here, the energy that is imparted on the oxygen atoms or the oxygen ions and the dose of the oxygen atoms or the oxygen ions can be controlled. For example, if the inside of the chamber is provided with a floating potential without applying RF power to the lower electrode, then the majority of the oxidizing species 122 that is implanted into the metal film 102 is atomic oxygen. Alternatively, if RF power is applied to the lower electrode, then the oxygen ions in the oxidizing species 122 are implanted into the metal film 102 due to the self-bias voltage. That is, by using $O_2$ gas 113 to perform plasma processing with respect to the metal film 102, that is, the Hf metal film, the Hf metal film can be oxidized while the depth and the amount of oxygen atoms or oxygen ions that are implanted into the Hf metal film are controlled. Due to this oxidizing process, the metal film 102 made of Hf becomes the metal oxide film 103 made of $HfO_2$, and the metal oxide film 103, which has a stoichiometric composition ratio, is employed as the gate insulating film of the transistor. It should be noted that in order to oxidize the metal film 102 but prevent the supply of oxygen to the silicon substrate 101 and avoid the formation of an interface layer between the substrate 101 and the metal film 102, it is necessary to control the energy of the oxygen atoms or the oxygen ions in correspondence with the film thickness of the metal film 102 that is processed.

Incidentally, in the metal film 102 oxidation process shown in FIG. 1B, the total reaction amount of the metal film 102 or the amount of implanted oxidizing species 122 can be controlled by the processing time. However, in a metal oxide film 103 formed under such non-equilibrium conditions, there is insufficient bonding between the oxygen atoms and the metal atoms (Hf atoms) as well as insufficient uniformity in the oxygen concentration distribution.

Figure 1C:
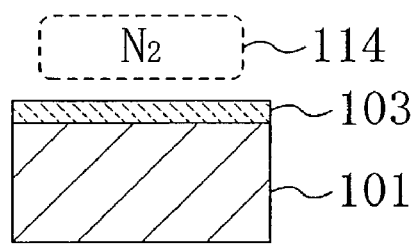

Accordingly, to obtain a metal oxide film 103 having adequate electrical properties, the substrate 101 onto which the metal oxide film 103 has been formed is heated in a post-processing step of the oxidation process of the metal film 102 shown in FIG. 1B. More specifically, as shown in FIG. 1C, the substrate 101 is placed in a chamber (not shown), and $N_2$ gas 114 is introduced into that chamber. Thus, the inside of the chamber becomes a non-oxidizing atmosphere. Then, annealing is performed by heating the substrate 101.

Figure 1D:
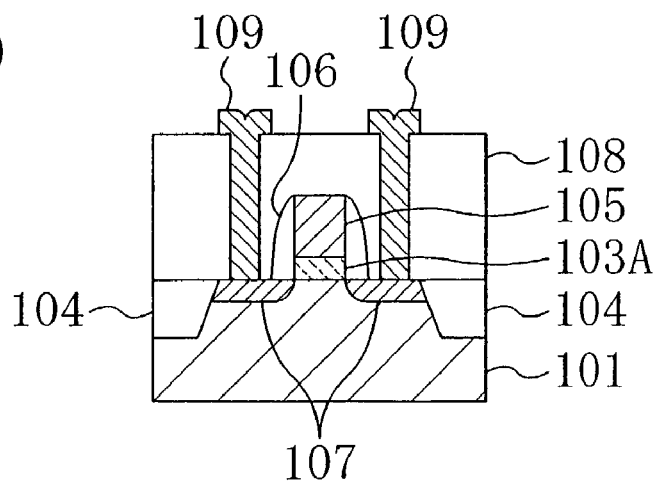

Next, as shown in FIG. 1D, a gate electrode 105 is formed on the substrate 101 with a gate insulating film 103A made of the metal oxide film 103 interposed between them. It should be noted that before this, an isolation film 104 having an STI (shallow trench isolation) structure, for example, has been formed in the substrate 101.

Next, insulating side walls 106 are formed on the lateral surfaces of the gate electrode 105, after which impurity diffusion layers 107 that serve as a source region and a drain region are formed in the surface portion of the substrate 101, and then an interlayer insulating film 108 is formed over the substrate 101, including over the gate electrode 105, for example. Then, wiring 109 that includes plug portions for connecting to the impurity diffusion layers 107 is formed on the interlayer insulating film 108, thus completing an n-type MOSFET.

As explained above, according to Embodiment 1, the metal oxide film 103 is formed by depositing the metal film 102 onto the substrate 101 in a non-oxidizing atmosphere and then oxidizing the metal film 102 in an oxidizing atmosphere. Thus, the metal oxide film 103 can be formed without the substrate 101 being directly exposed to an oxidizing atmosphere. Accordingly, oxidation of the substrate 101 can be prevented, and as a result, an interface layer with a low dielectric constant is not formed between the substrate 101 and the metal oxide film 103. This is because oxygen is not diffused toward the substrate 101 during deposition of the metal film 102, as the non-oxidizing atmosphere substantially does not include oxygen. Consequently, the gate insulating film 103A made of only a high dielectric constant material, that is, the metal oxide film ($HfO_2$ film) 103, can be formed without an interface layer being formed on the substrate 101, so that even if the transistor is made small, the overall capacitance of the transistor can be prevented from dropping, thus improving MOSFET performance.

Also, according to Embodiment 1, annealing by heating the substrate 101 onto which the metal oxide film 103 has been formed is carried out as a post-processing step in the metal film 102 oxidization process shown in FIG. 1B. Accordingly, the oxygen concentration distribution in the metal oxide film 103 can be made uniform, so that the composition ratio of the metal oxide film 103, that is, the Hf oxide film, can be given a stoichiometric composition ratio.

Figure 2:
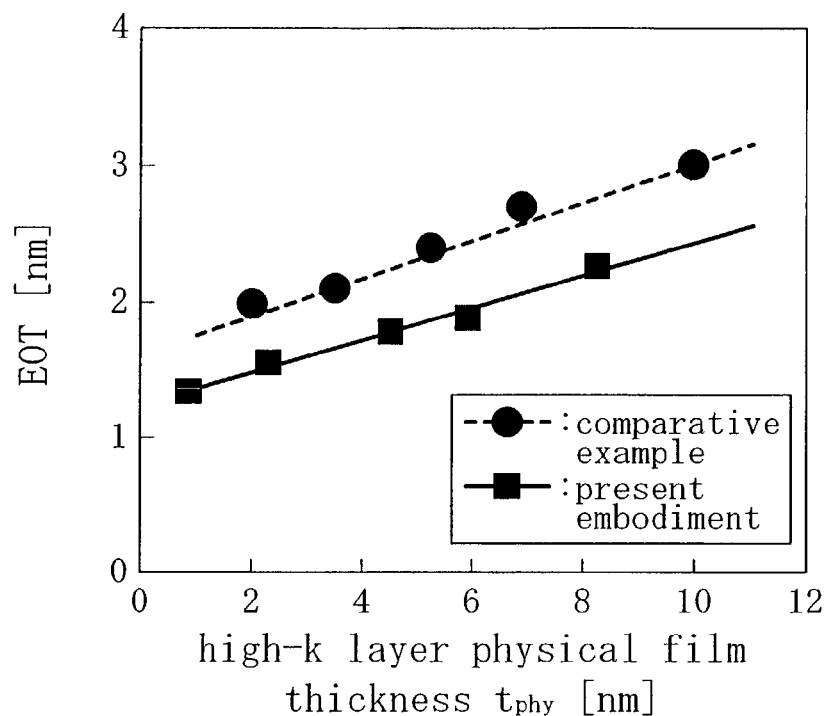
FIG. 2 shows the correlation between the high-k layer physical film thickness $t_{phy}$ and the EOT of the entire layered structure made of the high-k layer and the interface layer below the high-k layer, in the semiconductor device manufacturing method according to Embodiment 1 of the present invention.

FIG. 2 shows the electrical properties of the Hf oxide film, that is, the high-k layer, in a case where annealing is performed in an atmosphere that substantially does not include oxygen, following deposition of the metal oxide film (Hf oxide film) 103 in the present embodiment. More specifically, it shows the correlation between the high-k layer physical film thickness $t_{phy}$ and the equivalent oxide ($SiO_2$ film) thickness (EOT) of the entire layered structure made of the high-k layer and the interface layer below the high-k layer. The atmosphere that substantially does not include oxygen includes at least one of helium, neon, argon, krypton, xenon, radon, and nitrogen (that is, the various inert gases). The atmosphere that substantially does not include oxygen can also be a vacuum. It should be noted that in FIG. 2, as a comparative example, the electrical properties of an Hf oxide film that is annealed, after being deposited, in an atmosphere that includes oxygen are shown.

As shown in FIG. 2, according to this embodiment, the interface layer contribution to the EOT (the EOT value assuming a high-k layer physical film thickness of 0 nm) is about 1 nm, which is about 0.5 nm less than that of the comparative example. Additionally, taking into consideration the results shown in FIG. 2 and the dielectric constant of the interface layer, it is clear that in the present embodiment, the physical film thickness of the interface layer itself was significantly decreased to about 2 nm. That is, with the present embodiment, by using the metal oxide film 103 as the gate insulating film, MOSFET performance can be increased. On the other hand, in the comparative example, annealing is carried out in an atmosphere that includes oxygen, and thus the supply of oxygen to the substrate interface cannot be avoided, resulting in the formation of a low dielectric constant layer made of silicate. Consequently, the dielectric constant of the entire gate insulating film (high-k layer and interface layer) is lowered, and thus the EOT increases as shown in FIG. 2.

According to Embodiment 1, the metal film 102 made of Hf metal is deposited on the substrate 101 by sputtering using the target 111 made of Hf metal while evacuating the chamber (not shown) with a non-oxidizing atmosphere. Thus, the metal film 102 can be formed while the formation of an interface layer is reliably prevented. Here, the chamber that is used in the deposition step (see FIG. 1A) of the metal film 102 and the chamber used in the oxidation step (see FIG. 1B) of the metal film 102 can be the same chamber or can be different chambers. Also, during the deposition step of the metal film 102, the target 111 can be a metal oxide target or a metal nitride target.

In Embodiment 1, a silicon substrate was used as the substrate 101, but in place of a silicon substrate, it is also possible to employ a silicon germanium substrate, a gallium arsenide substrate, a p-type silicon substrate, an n-type silicon substrate, an SOI (silicon on insulator) substrate, an SiC substrate, or a glass substrate, among others.

Also, in Embodiment 1, Hf metal was used as the target 111 in the sputtering for depositing the metal film 102, but there are no particular limitations to the material of the target 111, as long as it is a metal whose oxide has a high dielectric constant. More specifically, the target 111 is preferably any one metal from zirconium (Zr), titanium (Ti), tantalum (Ta), aluminum (Al), and the lanthanoids, among others, or a mixture including two or more metals from these metals. Put differently, the metal film 102 preferably includes at least one of hafnium, zirconium, titanium, tantalum, aluminum, and a lanthanoid. As a result, the metal oxide film 103 formed by oxidizing the metal film 102 has a high dielectric constant, so that by employing the metal oxide film 103 as the gate insulating film 103A, the capacitance of the gate insulating film can be prevented from dropping, even if the transistor is made compact, and thus MOSFET performance can be increased. However, in this specification, metal is used to refer to a simple substance that in solid form is malleable and ductile, has luster, and is a good conductor of electricity and heat. In general, such metals can be subject to various mechanical processes. More specifically, metals are elements belonging to Group I other than hydrogen, elements belonging to Group II, elements belonging to Group III other than boron, elements belonging to Group IV other than carbon and silicon, elements belonging to Group VIII, and elements belonging to the A subgroups of Groups V, VI, and VII. In addition, bismuth and polonium are also metallic elements. Boron and antimony, for example, are metaloids, and silicon is not a metallic element.

In Embodiment 1, the non-oxidizing atmosphere in the deposition step (see FIG. 1A) for the metal film 102 is an atmosphere in which the substrate 101 is not oxidized. Put differently, "non-oxidizing atmosphere" means an atmosphere that substantially does not include oxygen. That is, an atmosphere that includes some oxygen but is not an atmosphere in which the substrate 101 is oxidized (i.e. an atmosphere in which an interface layer is not formed on the substrate) shall be regarded as a non-oxidizing atmosphere. However, it is preferable that the partial pressure of oxygen in the non-oxidizing atmosphere is not more than $1.33 \times 10^{-2}$ Pa. Accordingly, the risk of the substrate 101 oxidizing is reliably decreased. It is also preferable that the non-oxidizing atmosphere includes at least one of helium, neon, argon, krypton, xenon, radon, and nitrogen, for example. Thus, the risk of the substrate 101 oxidizing is reliably decreased, and as a result, the formation of an interface layer on the substrate 101 can be reliably prevented. It is particularly preferable that the non-oxidizing atmosphere includes at least one of the aforementioned gases and that the partial pressure of oxygen in the non-oxidizing atmosphere (included in the non-oxidizing atmosphere as a gas in addition to the aforementioned gases) is not more than $1.33 \times 10^{-2}$ Pa. It should be noted that it is difficult to oxidize the substrate in a vacuum, and therefore the non-oxidizing atmosphere can alternatively be a vacuum.

Furthermore, in Embodiment 1, the oxidizing atmosphere in the oxidation process (see FIG. 1B) for the metal film 102 is an atmosphere that substantially includes oxygen. Put differently, "oxidizing atmosphere" means an atmosphere in which oxidation substantially proceeds on the substrate 101 on which the metal film 102 is formed. That is, the oxidizing atmosphere includes oxidizing species such as atomic oxygen, molecular oxygen, or oxygen ions, but there are no particular limitations to the oxidizing species included in the oxidizing atmosphere as long as the seed oxidizes the metal film 102. For example, the oxidizing atmosphere can include oxygen that has been turned into a plasma or oxygen that has been excited by light. However, it is necessary that control corresponding to the type of oxidizing species included in the oxidizing atmosphere is performed. For example, if the oxidizing species includes oxygen ions, then implantation into the substrate 101 (more precisely, the substrate 101 onto which the metal film 102 has been formed) is possible even at low temperatures, so that the depth of implantation into the substrate 101 can be controlled.

In Embodiment 1, $O_2$ gas 113 was introduced into the plasma processing chamber (not shown) in the oxidation process (see FIG. 1B) of the metal film 102. However, in place of the $O_2$ gas 113, $N_2O$ gas, or a gas mixture of an oxidizing gas such as $O_2$ gas or $N_2O$ gas and an inert gas or nitrogen gas can also be introduced. That is, there are no particular limitations regarding the gas that is introduced into the plasma processing chamber, as long as the gas oxidizes the metal film 102.

Furthermore, in Embodiment 1, the metal film 102 was formed directly onto the substrate 101 made of silicon. However, nitridation of the substrate 101 can be carried out in a pre-process before the metal film 102 is formed. More specifically, the substrate 101 is placed into a chamber filled with nitrogen or ammonia and the surface of the substrate is nitrided. Thus, the silicon atoms at the uppermost surface portion of the substrate and the nitrogen atoms bond to form SiN. That is, the silicon atoms can be bonded with nitrogen atoms before bonding occurs between the silicon atoms and oxygen atoms. As a consequence, silicon atoms in the substrate 101 can be prevented from diffusing and bonding with oxygen, that is, the formation of an interface layer made of silicate can be prevented.

Further, in Embodiment 1, the native oxide film that exists on the surface of the substrate 101 can be removed by a hydrofluoric aqueous solution before the metal film 102 is formed on the substrate 101. Thus, a clean silicon surface can be exposed on the substrate 101, so that dirt, moisture, and metals that have adhered during other processes, for example, can be removed from the substrate surface.

Also, in Embodiment 1, the sputtering time can be controlled during the deposition of the metal film 102 so as to obtain the metal film (Hf metal film) 102 at a desired thickness. In other words, the Hf metal film can be obtained at varying thicknesses by changing the sputtering time.

Further, in Embodiment 1, it is preferable that during deposition of the metal film 102, the temperature of the substrate 101 is maintained at not less than 0° C. and not more than 300° C. This is because by lowering the temperature of the substrate 101, the risk that the substrate 101 will be oxidized can be further decreased. In this case, it is further preferable that the temperature of the substrate 101 is maintained at not less than 100° C. and not more than 200° C. Because moisture on the substrate 101 vaporizes when the temperature of the substrate 101 is 100° C. or more, the metal film 102 is more easily formed on the substrate 101. However, as mentioned above, it becomes difficult to form an interface layer on the substrate 101 when the substrate 101 temperature is low. Also, if an Hf metal film is adopted as the metal film 102, as is the case in the present embodiment, then, when the temperature of the substrate 101 is 600° C. or less, an amorphous metal film 102 can be formed and columnar structures can be prevented from occurring in the cross section structure of the metal film 102.

In Embodiment 1, it is preferable that during deposition of the metal film 102 the energy per metal particle making up the metal film 102 is set to 1 eV or less when the metal particles are propelled toward the substrate 101. In particular, if the inside of the chamber during deposition of the metal film 102 is a vacuum of about 400 Pa, then it is preferable that the energy per metal particle mentioned above is not less than 0.05 eV and not more than 1 eV. The reason behind this is as follows. When the metal particles that are propelled onto the substrate 101 have high energy, then the metal particles enter into the substrate 101, which causes a mixing effect in which the silicon atoms of the substrate 101 and the metal atoms mix with one another. As a result, silicide, which is an alloy, is formed on the substrate 101 surface below the metal film 102. If silicide is formed, then the silicide also is oxidized during oxidation of the metal film 102, and therefore there is a risk that the entire silicide will be changed into an interface layer made of silicate. Consequently, because it is not desirable that silicide is formed during deposition of the metal film 102, it is necessary that the energy per metal particle is set to not more than 1 eV. A conceivable method for reducing the energy per metal particle is using, in place of sputtering, a film deposition method in which the metal particles have a particle energy of only about the thermal energy, for example, vacuum evaporation, electron beam evaporation, laser evaporation, or CVD (chemical vapor deposition), to perform deposition of the metal film 102.

In Embodiment 1, it is preferable that during oxidation of the metal film 102 (see FIG. 1B) the temperature of the substrate 101 is maintained at not less than 0° C. and not more than 300° C. This is because by lowering the temperature of the substrate 101, the risk that the substrate 101 will be oxidized can be further decreased. It should be noted that the oxidation process in the present embodiment means changing a metal film or a metal nitride film into a metal oxide film or a metal oxide nitride film by processing in an oxidizing atmosphere.

Figure 3:
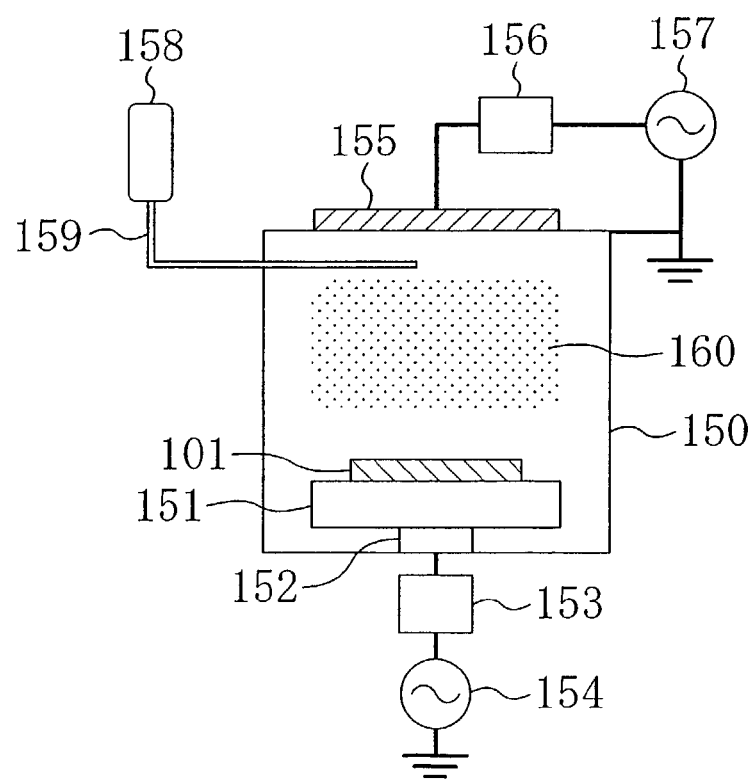
FIG. 3 schematically shows the configuration of one example of the oxidation system (plasma processing system) used in the semiconductor device manufacturing method according to Embodiment 1 of the present invention.

Here, FIG. 3 schematically shows the configuration of a plasma processing system as a specific example of the oxidation system that is employed for the oxidation process of the present embodiment. As shown in FIG. 3, the plasma processing system has a plasma processing chamber 150 into which the substrate 101 on which the metal film 102 has been deposited is introduced. A lower electrode 151 is attached to the lower of the plasma processing chamber 150 with a holding member 152 interposed between them, and the substrate 101 is arranged on the lower electrode 151. RF power is applied to the lower electrode 151 from a first RF power source 154 via a first matching box 153. An RF electrode 155 is attached to the ceiling portion of the plasma processing chamber 150, and RF power from a second RF power source 157 is applied to the RF electrode 155 via a second matching box 156. An oxidizing gas such as $O_2$ gas or $N_2O$ gas is introduced into the plasma processing chamber 150 from a process gas tank 158 via a gas supply line 159. When RF power is applied to the RF electrode 155 in a state where the oxidizing gas has been introduced into the plasma processing chamber 150, a plasma 160 is generated. At this time, due to the power that is applied to the lower electrode 151, the energy of the oxygen atoms (including radicals) or the oxygen ions that react with the Hf metal layer (not shown) on the substrate 101 and the dose of the oxygen atoms or the oxygen ions can be controlled. For example, if the inside of the chamber 150 is provided with a floating potential without applying RF power to the lower electrode 151, then the majority of oxygen seeds that are implanted into the metal film are oxygen atoms. Alternatively, if an RF power is applied to the lower electrode 151, then the oxygen ions in the oxidizing species are implanted into the metal film due to the self-bias voltage. That is, by using a gas including $O_2$ gas or $N_2O$ gas to perform plasma processing with respect to the Hf metal film, the Hf metal film can be oxidized while the depth and the amount of oxygen ions or oxygen atoms that are implanted into the Hf metal film are controlled. Here, the oxidizing species implanted into the metal film can be oxygen that has been energized by light.

Figure 4:
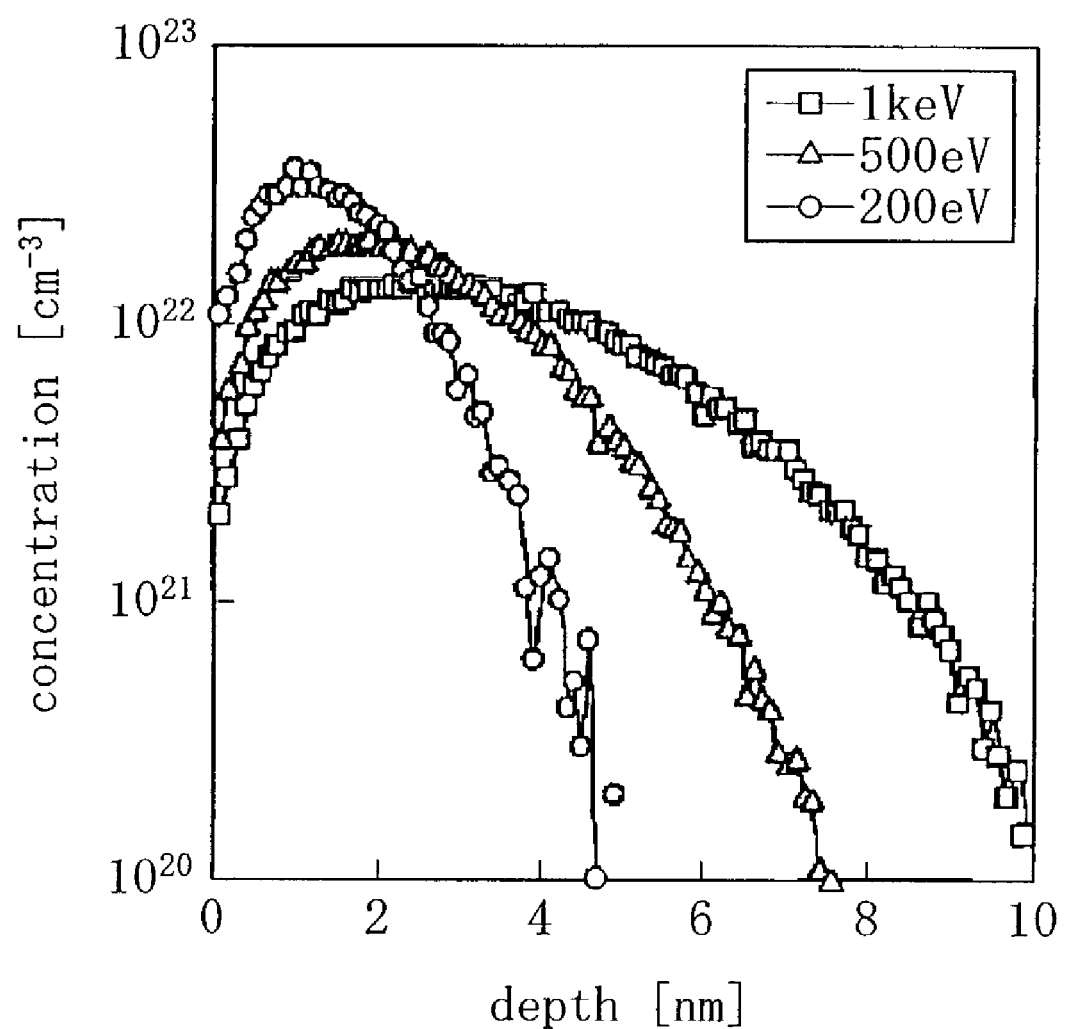
FIG. 4 shows the oxygen concentration profile in the depth direction in a case where oxygen ions at varied energies are implanted into the Hf metal film in the semiconductor device manufacturing method according to Embodiment 1 of the present invention.

As mentioned above, the processing depth (the thickness to which the Hf metal film is oxidized) during the oxidation process for the metal film 102, that is, the Hf metal film, can be controlled by the energy of the oxygen atoms or the oxygen ions. FIG. 4 shows the oxygen concentration profile in the depth direction in a case where oxygen ions having various energies are implanted into the Hf metal film in the present embodiment. In FIG. 4, the vertical axis denotes the concentration (unit: $cm^{-3}$) and the horizontal axis denotes the implantation depth (unit: nm). As shown in FIG. 4, the range of oxygen ion penetration into the Hf metal film, that is, the processing depth of the Hf metal film, increases in accordance with increasing ion implantation energies of 200 eV, 500 eV, and 1 keV.

Additionally, in Embodiment 1, a plasma processing system was used as the oxidizing system for oxidizing the metal film 102, but in place of this system, an ion implantation system, an ion source, a plasma generating system, or a sputtering system, for example, may also be used. Also, plasma was used to impart energy to the oxidizing species (oxygen atoms or oxygen ions) in the oxidation step of the metal film 102, but in place of plasma, it is also to possible to impart energy to the oxygen atoms or the oxygen ions using a laser or ultraviolet light, for example.

In Embodiment 1, it is preferable that after oxidation of the metal film 102, the step (see FIG. 1C) of annealing by heating the substrate 101 onto which the metal oxide film 103 has been formed is carried out in a non-oxidizing atmosphere. Thus, oxidation of the substrate 101 can be prevented. Here, it is preferable that the non-oxidizing atmosphere includes at least one of helium, neon, argon, krypton, xenon, radon, and nitrogen, for example. That is, the non-oxidizing atmosphere can be composed of an inert gas. Alternatively, the non-oxidizing atmosphere can be a vacuum. It is further preferable that, in the aforementioned annealing step, the temperature of the substrate 101 is not less than 0° C. and not more than 600° C. Accordingly, oxidation of the substrate 101 can be prevented. Also, the metal oxide film 103 can be maintained in an amorphous state and columnar structures can be prevented from forming in the cross section structure of the metal oxide film 103.

As a modified example of the present embodiment, FIG. 5 shows the transmission electron microscope image of the silicon substrate (schematic view) and the physical film thickness of the high dielectric constant layer (high-k layer) and the interface layer after a metal oxide film made of $HfO_2$ and having a constant thickness is deposited on an Hf metal layer that has been deposited on a silicon substrate at varying thicknesses. Here, the high-k layer includes, as a single unit, the metal oxide film that is deposited at a constant thickness and the metal oxide film that is made by oxidizing the Hf metal layer.

As shown in Case A of FIG. 5, after deposition of an only 1.3 nm thick $HfO_2$ layer without forming an Hf metal layer (the deposited thickness of the Hf metal layer is 0 nm), then the thickness of the interface layer is 2.8 nm, whereas the thickness of the high-k layer (that is, the $HfO_2$ layer after thermal processing) is 1.6 nm. In other words, in this case, the thickness of the interface layer is larger.

As shown in Case B of FIG. 5, after a 1.3 nm thick $HfO_2$ layer is deposited on a 1.3 nm thick Hf metal layer, then the thickness of the interface layer is 1.7 nm, whereas the thickness of the $HfO_2$ layer after thermal processing is 3.9 nm. In other words, in this case, the thickness of the interface layer is smaller.

As shown in Case C of FIG. 5, after a 1.3 nm thick $HfO_2$ layer is deposited on a 2.6 nm thick Hf metal layer, then the thickness of the interface layer is 0.8 nm, whereas the thickness of the $HfO_2$ layer after thermal processing is 5.7 nm. In other words, in this case, the thickness of the interface layer is even smaller.

As shown in Case D of FIG. 5, after a 1.3 nm thick $HfO_2$ layer is deposited on a 3.9 nm thick Hf metal layer, then the thickness of the interface layer is 0.5 nm, whereas the thickness of the $HfO_2$ layer after thermal processing is 7 nm. In other words, in this case, the thickness of the interface layer is smallest.

Figure 6:
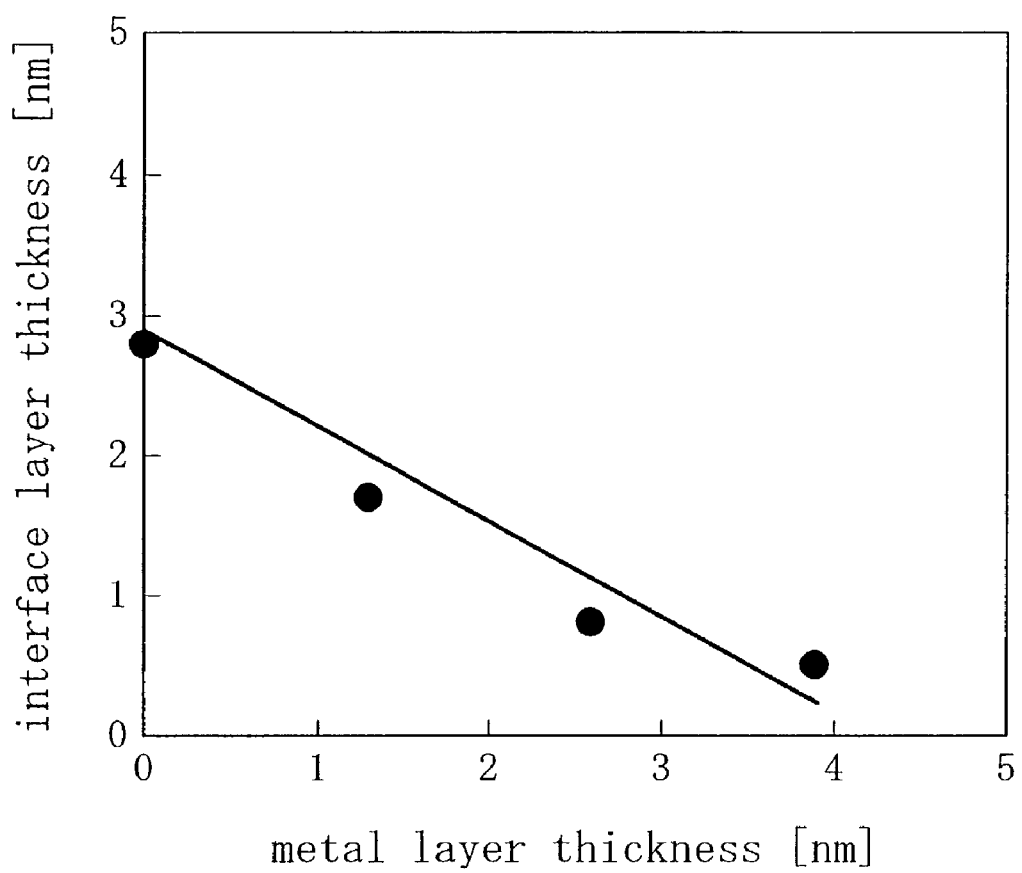
FIG. 6 shows the correlation between the deposited film thickness of the Hf metal layer and the physical film thickness of the interface layer based the data shown in FIG. 5.

In order to make the above description more apparent, FIG. 6 shows the correlation between the deposited film thickness of the Hf metal layer and the physical film thickness of the interface layer from the data shown in FIG. 5. As can be extrapolated from FIGS. 5 and 6, as the thickness of the initial metal layer (Hf metal layer) increases, the interface layer decreases in thickness. This is because the supply of oxygen to the substrate surface is inhibited by the presence of the initial metal layer, and this inhibits formation of the interface layer.

In other words, with a method in which a metal layer is deposited on a substrate and then a metal oxide layer is deposited on top of the metal layer, a high-k gate insulating film can be formed while the formation of a low-dielectric constant interface layer made of silicate is prevented. It should be noted that while this method can be used to severely inhibit the formation of an interface layer, the conditions when this method is used can be altered so as to form an extremely thin interface layer. More specifically, if the thickness of the interface layer can be kept to 1.7 nm or less, then the effect of an improvement in MOSFET performance can be obtained by depositing a high-dielectric constant film. In contrast, when the thickness of the interface layer is about 2 nm or more, then the effect of an improvement in MOSFET performance does not occur, even if a thick high-dielectric constant film is formed. Consequently, if a method is adopted in which a metal oxide layer is deposited on a metal layer after the metal layer has been deposited on a substrate, then it is preferable that the thickness of the interface layer is kept to 1.7 nm or less, and it is further preferable that an interface layer is not formed.

EMBODIMENT 2

Hereinafter, a semiconductor device manufacturing method according to Embodiment 2 of the present invention is described with reference to the drawings. Embodiment 2 differs from Embodiment 1 in that a metal nitride film (hafnium nitride (HfN) film) is used in place of the metal film (Hf metal film) 102 of Embodiment 1. Apart from this difference, Embodiment 2 is fundamentally the same as Embodiment 1 unless specifically mentioned otherwise.

Figure 7A:
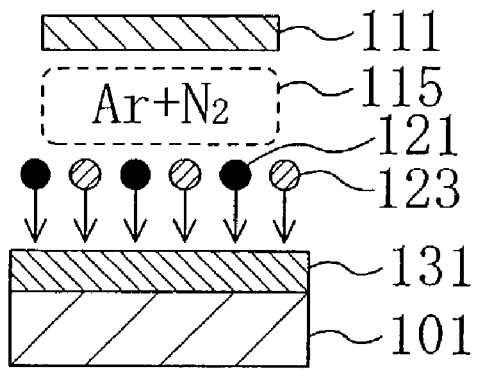
FIGS. 7A to 7C are cross-sectional views showing the steps of the semiconductor device manufacturing method according to Embodiment 2 of the present invention.
Figure 7B:
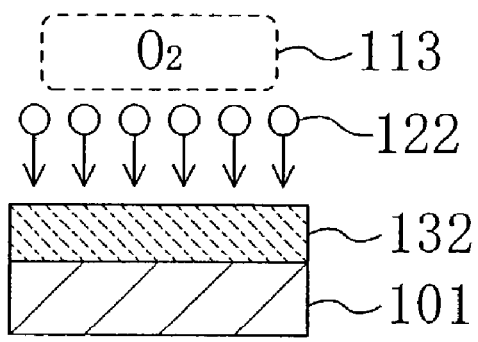
Figure 7C:
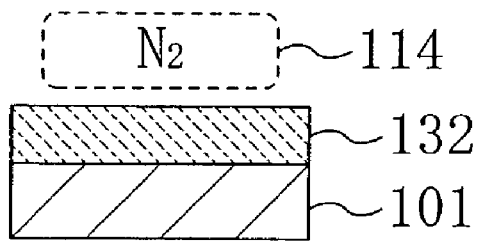

FIGS. 7A to 7C are cross-sectional views showing the steps of the semiconductor device manufacturing method according to Embodiment 2. It should be noted that in FIGS. 7A to 7C, structural elements that are identical to those of Embodiment 1 shown in FIGS. 1A to 1D have been assigned identical reference numerals and description thereof is omitted.

First, as shown in FIG. 7A, a substrate 101 made of silicon is placed inside a chamber (not shown) and a target 111 made of Hf metal, for example, is arranged inside the chamber. A gas mixture 115 made of Ar gas and $N_2$ gas is then introduced into the chamber. Thus, the inside of the chamber becomes a non-oxidizing atmosphere. Then, voltage is applied in the chamber to create an electrical discharge. As a consequence, Hf atoms 121 and N atoms 123 can be propelled toward the substrate 101 due to reactive sputtering, and as a result, a metal nitride film 131 made of HfN can be deposited on the substrate 101. It should be noted that in place of the gas mixture 115 of Ar gas and $N_2$ gas, it is possible to use a mixture gas of $N_2$ gas and an inert gas other than Ar.

Next, as shown in FIG. 7B, by oxidizing the metal nitride film 131 in an oxidizing atmosphere, a metal oxide nitride film 132 made of HfON is formed. More specifically, the substrate 101 onto which the metal nitride film 131 has been deposited is introduced into the plasma processing chamber (not shown) of a plasma processing system and placed on a lower electrode (not shown). Then, $O_2$ gas 113 is introduced into the plasma processing chamber, after which RF power is applied to the RF electrode (not shown) of the plasma processing system to generate a plasma made of the $O_2$ gas 113. Then, when power is applied to the lower electrode onto which the substrate 101 has been placed, oxidizing species 122 such as oxygen atoms including radicals and oxygen ions fly toward the metal nitride film 131. That is, by using the $O_2$ gas 113 to perform plasma processing with respect to the metal nitride film 131 made of HfN, oxygen is implanted into the metal nitride film 131, thereby forming the metal oxide nitride film 132 made of HfON. It should be noted that $N_2O$ gas, for example, can be used in place of the $O_2$ gas 113.

Next, the substrate 101 onto which the metal oxide nitride film 132 has been formed is heated in a post-processing step of the oxidation process for the metal nitride film 131 shown in FIG. 7B. More specifically, as shown in FIG. 7C, the substrate 101 is placed in a chamber (not shown) and $N_2$ gas 114 is introduced into that chamber. Thus, the inside of the chamber becomes a non-oxidizing atmosphere. Then, annealing is performed by heating the substrate 101. Thus, the oxygen concentration distribution in the metal oxide nitride film 132 can be made uniform while avoiding the supply of oxygen to the surface of the substrate 101, or in other words, while preventing the formation of an interface layer. This means that a metal oxide nitride film 132 having a stoichiometric composition ratio is obtained. It should be noted that the non-oxidizing atmosphere can be made of a noble gas instead of the $N_2$ gas 114.

Then, although omitted from the drawings, the metal oxide nitride film 132 is used as a gate insulating film in lieu of the metal oxide film 103 of Embodiment 1, thereby completing an n-type MOSFET in the same way as in the step shown in FIG. 1D according to Embodiment 1.

According to Embodiment 2, the following effects can be obtained in addition to those of Embodiment 1. That is, because the metal nitride film 131 is oxidized after it is formed on the substrate 101, the substrate 101 is not directly exposed to an oxidizing atmosphere. Also, the nitrogen atoms included in the metal nitride film 131 and the silicon atoms at the uppermost surface area of the substrate 101 bond to form SiN. Thus, the silicon atoms in the substrate 101 can be more reliably prevented from diffusing and bonding with oxygen atoms, that is, the formation of an interface layer can be more reliable prevented.

It should be noted that in Embodiment 2, a hafnium nitride film was adopted as the metal nitride film 131, but in place of this film it is also possible to adopt a zirconium nitride film, a titanium nitride film, a tantalum nitride film, an aluminum nitride film, or a lanthanoid nitride film, for example. Alternatively, the metal nitride film 131 can include at least one of hafnium nitride, zirconium nitride, titanium nitride, tantalum nitride, aluminum nitride, and a lanthanoid nitride. Thus, a metal oxide nitride film with a high dielectric constant can be formed while direct exposure of the substrate 101 to an oxidizing atmosphere is prevented.

EMBODIMENT 3

Hereinafter, a semiconductor device manufacturing method according to Embodiment 3 of the present invention is described with reference to the drawings. Embodiment 3 differs from Embodiment 1 in that a metal oxide film (hafnium oxide (HfO$_2$) film) is substituted for the metal film (Hf metal film) 102 of Embodiment 1. Apart from this difference, Embodiment 3 is fundamentally the same as Embodiment 1 unless specifically mentioned otherwise.

Figure 8A:
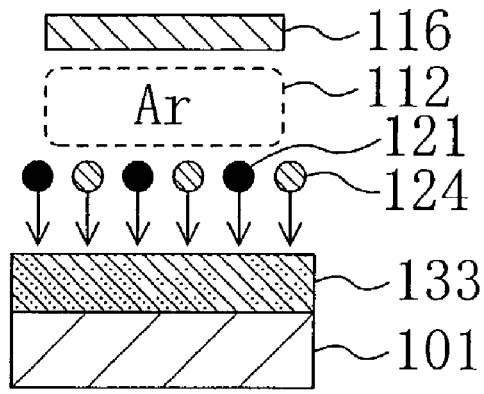
FIGS. 8A to 8C are cross-sectional views showing the steps of the semiconductor device manufacturing method according to Embodiment 3 of the present invention.
Figure 8B:
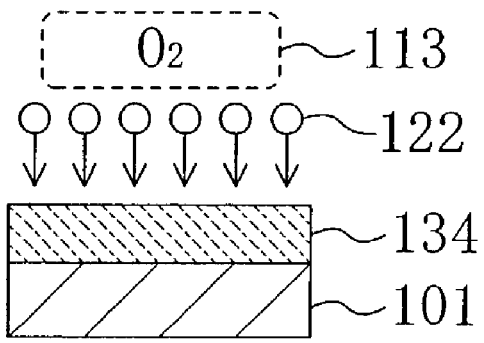
Figure 8C:
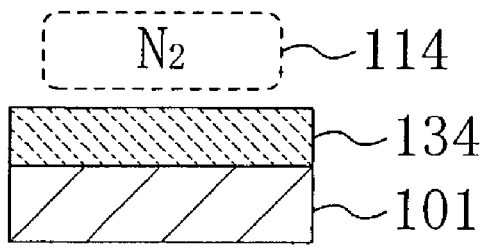

FIGS. 8A to 8C are cross-sectional views showing the steps of the semiconductor device manufacturing method according to Embodiment 3. It should be noted that in FIGS. 8A to 8C, structural elements that are identical to those of Embodiment 1 shown in FIGS. 1A to 1D have been assigned identical reference numerals and description thereof is omitted.

First, as shown in FIG. 8A, a substrate 101 made of silicon is placed inside a chamber (not shown) and a target 116 made of hafnium oxide (HfO$_2$), for example, is arranged inside the chamber. Ar gas 112 is then introduced into the chamber. Thus, the inside of the chamber becomes a non-oxidizing atmosphere. Then, voltage is applied in the chamber to generate an electrical discharge. As a consequence, Hf atoms 121 and oxygen atoms 124 can be propelled toward the substrate 101 due to reactive sputtering, and thus a metal oxide film 133 made of HfO$_{2-x}$ (0<x<2) can be deposited on the substrate 101. In the metal oxide film 133, there is a slight oxygen deficiency compared to the stoichiometric composition ratio.

Next, as shown in FIG. 8B, by oxidizing the metal oxide film 133 in an oxidizing atmosphere, a metal oxide film 134 made of HfO$_2$, that is, a metal oxide film 134 having a stoichiometric composition ratio, is formed. More specifically, the substrate 101 onto which the metal oxide film 133 has been deposited is introduced into the plasma processing chamber (not shown) of a plasma processing system and placed on a lower electrode (not shown). Then, O$_2$ gas 113 is introduced into the plasma processing chamber, after which RF power is applied to the RF electrode (not shown) of the plasma processing system to generate a plasma made of the O$_2$ gas 113. Then, when power is applied to the lower electrode onto which the substrate 101 has been placed, oxidizing species 122 of oxygen atoms including radicals and oxygen ions, for example, flies toward the metal oxide film 133. That is, by using the O$_2$ gas 113 to perform plasma processing with respect to the metal oxide film 133 made of HfO$_{2-x}$, oxygen is implanted into the metal oxide film 133, and the metal oxide film 134 made of HfO$_2$ is formed. It should be noted that N$_2$O gas, for example, can be used in place of the O$_2$ gas 113.

Next, the substrate 101 onto which the metal oxide film 134 has been formed is heated in a post-processing step of the oxidation process for the metal oxide film 133 shown in FIG. 8B. More specifically, as shown in FIG. 8C, the substrate 101 is placed in a chamber (not shown) and N$_2$ gas 114 is introduced into that chamber. Thus, the inside of the chamber becomes a non-oxidizing atmosphere. Then, annealing is performed by heating the substrate 101. Accordingly, the electrical properties of the metal oxide film 134 can be further improved while avoiding the supply of oxygen to the surface of the substrate 101, or in other words, while preventing the formation of an interface layer. It should be noted that the non-oxidizing atmosphere can be made of a noble gas instead of the N$_2$ gas 114.

Then, although omitted from the drawings, the metal oxide film 134 is used as a gate insulating film in lieu of the metal oxide film 103 of Embodiment 1, so as to complete an n-type MOSFET in the same way as in the process shown in FIG. 1D according to Embodiment 1.

According to Embodiment 3, the metal oxide film 134 is formed on the substrate without directly exposing the substrate 101 to the oxidizing atmosphere, so that like in Embodiment 1, a gate insulating film made of only the metal oxide film 134, which is a high-dielectric constant material, can be formed, while oxidation of the substrate 101 is severely inhibited, that is, while the formation of a low-dielectric constant interface layer made of silicate, for example, is inhibited.

It should be noted that in Embodiment 3, a hafnium oxide film was adopted as the metal oxide film 133 (that is, the metal oxide film 134), but a zirconium oxide film, a titanium oxide film, a tantalum oxide film, an aluminum oxide film, or a lanthanoid oxide film, for example, can be used instead. Also, the metal oxide film 133 can include at least one of hafnium oxide, zirconium oxide, titanium oxide, tantalum oxide, aluminum oxide, and a lanthanoid oxide. Thus, a metal oxide film with a high dielectric constant can be formed while oxidation of the substrate 101 is prevented.

EMBODIMENT 4

Hereinafter, a semiconductor device manufacturing method according to Embodiment 4 of the present invention is described with reference to the drawings. It should be noted that Embodiment 4 differs from Embodiment 1 in the following aspect. That is, in Embodiment 4, the metal oxide film that is formed through oxidation of the metal film (the initial metal layer) is thinner than the gate insulating film that is to be formed. Accordingly, the metal film is repeatedly deposited and oxidized so as to increase the film thickness of the metal oxide film and thereby obtain a metal oxide film having a desired thickness for use as the gate insulating film. Aside from this difference, Embodiment 4 is fundamentally the same as Embodiment 1 unless specifically mentioned otherwise.

FIGS. 9A to 9D are cross-sectional views showing the steps of the semiconductor device manufacturing method (more specifically, the method of forming a gate insulating film made of $HfO_2$) according to Embodiment 4. It should be noted that in FIGS. 9A to 9D, structural elements that are identical to those of Embodiment 1 and shown in FIGS. 1A to 1D have been assigned identical reference numerals and description thereof is omitted.

Figure 9A:
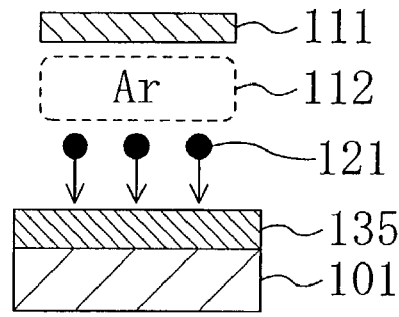
FIGS. 9A to 9D are cross-sectional views showing the steps of the semiconductor device manufacturing method according to Embodiment 4 of the present invention.

First, the native oxide film (not shown) that is present on the surface of a substrate 101 made of silicon is removed using a hydrofluoric acid aqueous solution, so as to expose a clean silicon surface on the substrate 101. Next, as shown in FIG. 9A, the substrate 101 is placed inside the chamber (not shown) of a film deposition system and a target 111 made of Hf metal, for example, is arranged in the chamber. Then, Ar gas 112 is introduced into the chamber. Thus, the inside of the chamber becomes a non-oxidizing atmosphere. It should be noted that the non-oxidizing atmosphere, that is, an atmosphere that substantially does not include oxygen, can be made of an inert gas other than Ar gas 112. Next, a direct voltage is applied inside the chamber to cause an electrical discharge. By doing this, Hf atoms 121 from the target 111 made of Hf metal fly toward the substrate 101 due to reactive sputtering. As a result, a first metal film 135 made of Hf metal is deposited on the substrate 101. Here, the sputtering time can be controlled so as to obtain a first metal film (Hf metal film) 135 having a desired thickness. Also, if deposition of the first metal film 135 is carried out with the substrate at temperature below the crystallization temperature of Hf metal (approximately 600° C.), an amorphous Hf metal film in which columnar structures are not observed in the cross section structure can be formed.

Figure 9B:
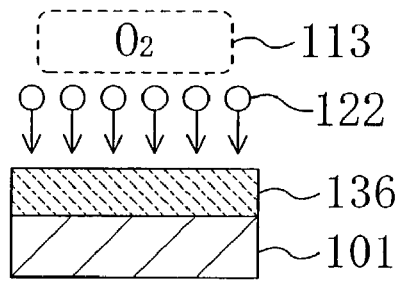

Next, as shown in FIG. 9B, by oxidizing the first metal film 135 in an oxidizing atmosphere, a first metal oxide film 136 made of $HfO_2$ is formed. More specifically, the substrate 101 onto which the first metal film 135 has been deposited is introduced into the plasma processing chamber of a plasma processing system (not shown) and placed on a lower electrode (not shown). Then, $O_2$ gas 113 is introduced into the plasma processing chamber, after which RF power is applied to the RF electrode (not shown) of the plasma processing system to generate a plasma made of the $O_2$ gas 113. Next, when power is applied to the lower electrode onto which the substrate 101 has been placed, oxidizing species 122 of oxygen atoms that includes radicals, and oxygen ions, for example, flies toward the first metal film 135. That is, by using $O_2$ gas 113 to perform plasma processing with respect to the first metal film 135 made of Hf metal, oxygen is implanted into the first metal film 135 and the first metal oxide film 136 made of $HfO_2$ is formed as a result. It should be noted that $N_2O$ gas, for example, can be used in place of the $O_2$ gas 113.

Figure 9C:
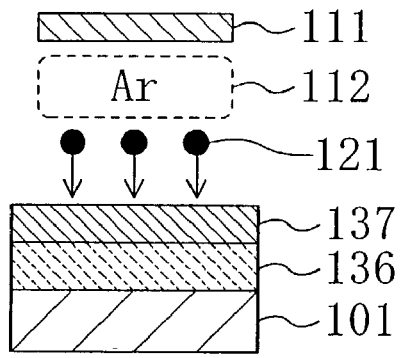

Next, as shown in FIG. 9C, in the same way as in the step shown in FIG. 9A, the target 111 made of Hf metal is used, and in an atmosphere of the Ar gas 112 (a non-oxidizing atmosphere that substantially does not include oxygen), the Hf atoms 121 are propelled toward the substrate 101 due to reactive sputtering. Thus, a second metal film 137 made of Hf metal is deposited on the first metal oxide film 136.

Figure 9D:
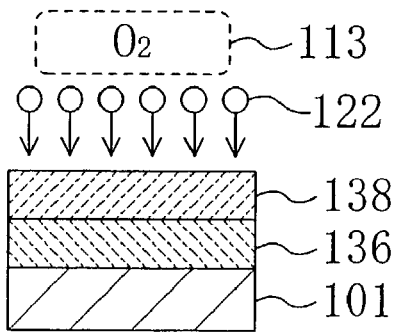

Then, as shown in FIG. 9D, in the same way as in the step shown in FIG. 9B, plasma processing is performed using the $O_2$ gas 113 so as to propel the oxidizing species 122, such as oxygen atoms including radicals or oxygen ions, toward the second metal film 137. Accordingly, the second metal film 137 is oxidized and a second metal oxide film 138 made of $HfO_2$ is formed.

In the present embodiment, as detailed above, by repeating the steps of depositing a metal film and exposing that metal film to an oxidizing atmosphere, the final film thickness of the metal oxide film (or more precisely, the layered body of metal oxide films) can be obtained at a desired value. Here, by setting the film thickness of the metal film (Hf metal film) at the time that the metal film is oxidized to substantially equal to or not more than the range of implantation the oxidizing species, for example the oxygen ions, the formation of an interface layer due to the supply of oxygen to the substrate can be inhibited.

It should be noted that when the above-mentioned repetition of deposition and oxidation of the metal film is finished, there is insufficient bonding between the oxygen atoms and the metal atoms (Hf atoms) and an insufficient degree of uniformity of the oxygen concentration distribution in the layered body of the metal oxide films. Thus, in order to obtain a metal oxide film that has sufficient electrical properties, it is necessary to anneal the metal oxide film that has achieved the final film thickness through the above deposition and oxidation of the metal film. Subsequently, although not shown in the drawings, the metal oxide film that has reached the final film thickness is employed as the gate insulating film in place of the metal oxide film 103 of Embodiment 1, and an n-type MOSFET is completed in the same way as in the step shown in FIG. 1D according to Embodiment 1.

According to Embodiment 4, the following effect can be obtained in addition to the effects of Embodiment 1. That is, even if the film thickness of the metal oxide film that is formed though oxidation of the metal film is smaller than the film thickness of the gate insulating film to be formed, the film thickness of the metal oxide film can be increased up to the desired film thickness (film thickness of the gate insulating film to be formed) because deposition and oxidation of the metal film are repeated.

EMBODIMENT 5

Hereinafter, a semiconductor device manufacturing method according to Embodiment 5 of the present invention is described with reference to the drawings. It should be noted that Embodiment 5 differs from Embodiment 1 in the following aspect. That is, in Embodiment 5, the metal oxide film that is formed through oxidation of the metal film (the initial metal layer) is thicker than the gate insulating film to be formed. Accordingly, after oxidation of the metal film, or after thermal processing following this oxidation, the metal oxide film is subjected to dry etching or wet etching. Then, the metal oxide film that has been made thin as a result, that is, the metal oxide film having a desired thickness, is used as the gate insulating film. Aside from this difference, Embodiment 5 is fundamentally the same as Embodiment 1 unless specifically mentioned otherwise.

Figure 10A:
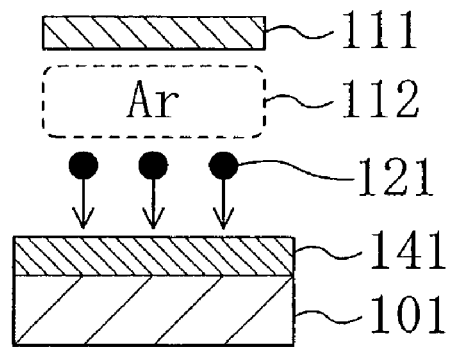
FIGS. 10A to 10C are cross-sectional views showing the steps of the semiconductor device manufacturing method according to Embodiment 5 of the present invention.
Figure 10B:
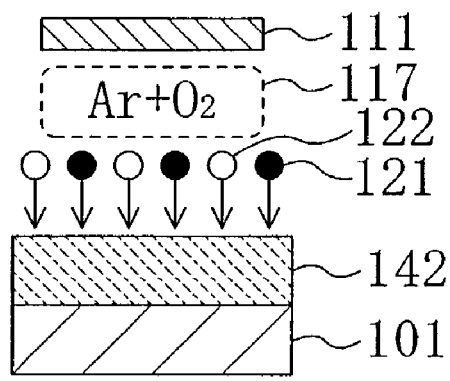
Figure 10C:
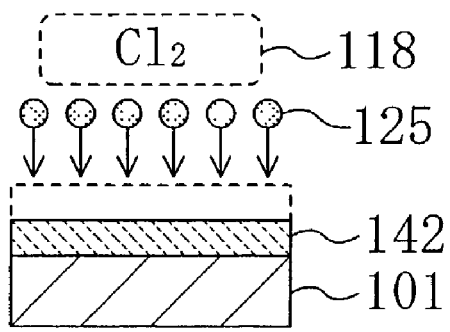
Figure 11:
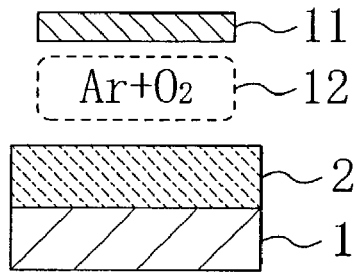
FIG. 11 is a cross-sectional view showing a conventional semiconductor device manufacturing method.
Figure 12:
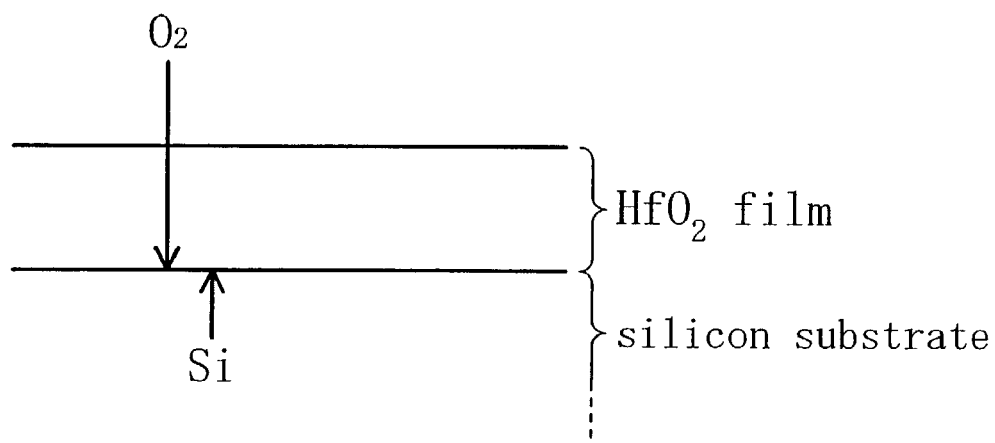
FIG. 12 is a diagram showing how silicon diffusion and oxygen diffusion occur in the conventional semiconductor device manufacturing method.
Figure 13:
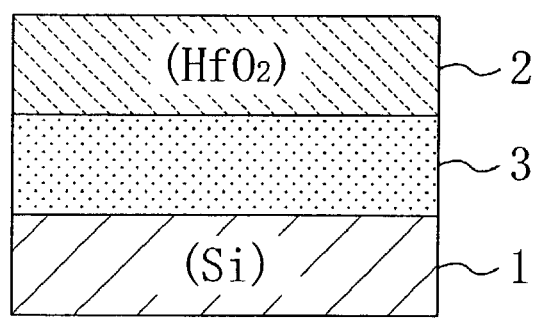
FIG. 13 is a diagram showing how an interface layer is formed between the silicon substrate and the metal oxide film in the conventional semiconductor device manufacturing method.

FIGS. 10A to 10C are cross-sectional views showing the steps of the semiconductor device manufacturing method according to Embodiment 5. It should be noted that in FIGS. 10A to 10C, structural elements that are identical to those of Embodiment 1 shown in FIGS. 1A to 1D have been assigned identical reference numerals and description thereof is omitted.

First, as shown in FIG. 10A, a metal film 141 made of Hf metal is formed directly onto a substrate 101 made of silicon by sputtering. More specifically, the substrate 101 is placed inside the chamber of a film deposition system (not shown), a target 111 made of Hf metal, for example, is arranged in the chamber, and then Ar gas 112 is introduced into the chamber. Thus, the inside of the chamber is a non-oxidizing atmosphere. It should be noted that the non-oxidizing atmosphere, that is, an atmosphere that substantially does not include oxygen, can be made of an inert gas other than the Ar gas 112. Next, a direct voltage is applied in the chamber to generate an electrical discharge. As a consequence, Hf atoms 121 from the target 111 made of Hf metal fly toward the substrate 101 due to reactive sputtering, and as a result, a metal film (Hf metal film) 141 made of Hf metal is deposited on the substrate 101. Here, the sputtering time can be controlled so as to obtain the metal film 141 at a desired thickness. Also, if deposition of the metal film 141 is carried out with the substrate at a temperature below the crystallization temperature of Hf metal (approximately 600° C.), an amorphous Hf metal film in which columnar structures are not observed in the cross section structure can be formed.

Next, as shown in FIG. 10B, after $O_2$ gas in addition to the Ar gas 112 is introduced into the chamber used in the deposition step for the metal film 141 shown in FIG. 10A, that is, after a gas mixture 117 of Ar gas and $O_2$ gas is introduced, the target 111 made of Hf metal is used to once again carry out reactive sputtering in the oxidizing atmosphere. Consequently, the Hf atoms 121 and oxidizing species 122 of oxygen ions and oxygen atoms including radicals, for example, fly toward the substrate 101, resulting in the deposition of a metal oxide film 142 made of $HfO_2$. At this time, the metal film 141 deposited earlier is also oxidized in the oxidizing atmosphere and becomes a portion of the metal oxide film 142. It should be noted that the chamber that is used in the deposition process for the metal oxide film 142 shown in FIG. 10B and the chamber used in the deposition process for the metal film 141 shown in FIG. 10A can be the same chamber or can be different chambers.

Then, although not shown in the drawings, the substrate 101 is subject to a thermal process at a temperature of 700° C. for 15 minutes in a non-oxidizing atmosphere, that is, in a nitrogen atmosphere that substantially does not include oxygen, for example. Thus, the formation of an interface layer made of silicate, for example, can be inhibited and the oxygen concentration distribution in the metal oxide film 142 can be made uniform, and as a result, the metal oxide film 142 made of $HfO_2$ and having a stoichiometric composition ratio can be obtained. The metal oxide film 142 made of $HfO_2$ and having a stoichiometric composition ratio can be used as the high-dielectric constant gate insulating film.

It should be noted that in the present embodiment, the thickness of the metal oxide film 142 that is formed in the process shown in FIG. 10B is greater than the film thickness of the gate insulating film to be formed, and thus, next, as shown in FIG. 10C, dry etching using $Cl_2$ gas 118 is performed with respect to the metal oxide film 142. Consequently, the metal oxide film 142 and chlorine atoms 125 react with one another, and the metal oxide film 142 can be reduced in thickness down to the desired thickness (thickness of the gate insulating film). It should be noted that in FIG. 10C, the outer form of the metal oxide film 142 at the point that it is deposited in the step shown in FIG. 10B is shown by the broken line. Next, although not shown in the drawings, the metal oxide film 142 that has been made thin through the above is used as the gate insulating film in place of the metal oxide film 103 of Embodiment 1, thereby completing an n-type MOSFET in the same way as in the step shown in FIG. 1D according to Embodiment 1.

According to Embodiment 5, the following effect is achieved in addition to the effects of Embodiment 1. That is, even if the film thickness of the metal oxide film 142 formed by oxidation of the metal film 141 is greater than the film thickness of the gate insulating film to be formed, the metal oxide film 142 can be etched so as to reduce the film thickness of the metal oxide film 142 down to the desired film thickness (the film thickness of the gate insulating film to be formed).

It should be noted that in Embodiment 5, dry etching was performed in order to reduce the film thickness of the metal oxide film 142, but wet etching can be used in place of dry etching.

Additionally, in Embodiment 5, the thermal processing for increasing the electrical properties of the metal oxide film 142 was carried out before the dry etching of the metal oxide film 142. However, as an alternative, the above-mentioned thermal processing can performed after the metal oxide film 142 is dry etched and the final film thickness of the metal oxide film 142 is established.

Also, in Embodiment 5, there are no particular limitations to the type of etching gas that is used in the dry etching of the metal oxide film 142, however, it is preferable that a gas containing chlorine, which includes at least one of chlorine atoms and chlorine ions, a gas containing fluorine, or a gas containing other halogens, for example, is used. Thus, the metal oxide film 142 can be reliably etched.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device manufacturing method comprising:
   a first step of depositing a metal film on a substrate in a non-oxidizing atmosphere; and
   a second step of forming a metal oxide film by oxidizing the metal film in an oxidizing atmosphere,
   wherein the first step includes a step of maintaining the temperature of the substrate at not less than 0° C. and not more than 300° C.; and
   a distance between the substrate and the metal oxide film is 1.7 nm or less after the second step.

2. The semiconductor device manufacturing method according to claim 1, wherein the metal oxide film is a gate insulating film of a transistor.

3. The semiconductor device manufacturing method according to claim 1, wherein the first step includes a step of depositing the metal film on the substrate through sputtering using a metal target while the inside of a chamber into which the substrate has been placed is turned into a non-oxidizing atmosphere.

4. The semiconductor device manufacturing method according to claim 1, wherein the metal film includes at least one of hafnium, zirconium, titanium, tantalum, aluminum, and a lanthanoid.

5. The semiconductor device manufacturing method according to claim 1, wherein a metal nitride film or a metal oxide film is deposited in place of the metal film in the first step.

6. The semiconductor device manufacturing method according to claim 5
   wherein the metal nitride film includes at least one of hafnium nitride, zirconium nitride, titanium nitride, tantalum nitride, aluminum nitride, and a lanthanoid nitride, and wherein the metal oxide film includes at least one of hafnium oxide, zirconium oxide, titanium oxide, tantalum oxide, aluminum oxide and a lanthanoid oxide.

7. The semiconductor device manufacturing method according to claim 1, wherein the oxidizing atmosphere in the second step includes oxygen ions.

8. The semiconductor device manufacturing method according to claim 1, wherein the oxidizing atmosphere in the second step includes oxygen that has been turned into a plasma or oxygen that has been excited by light.

9. The semiconductor device manufacturing method according to claim 1, wherein the second step includes a step of maintaining the temperature of the substrate at not less than 0° C. and not more than 300° C.

10. The semiconductor device manufacturing method according to claim 1, wherein the first step and the second step are repeated in alternation, thereby forming a metal oxide film having a desired thickness to serve as a gate insulating film.

11. The semiconductor device manufacturing method according to claim 1, further comprising, after the second step, a third step of heating the substrate.

12. The semiconductor device manufacturing method according to claim 11, wherein the third step is carried out in a non-oxidizing atmosphere.

13. The semiconductor device manufacturing method according to claim 12, wherein the non-oxidizing atmosphere in the third step is made of an inert gas or is a vacuum.

14. The semiconductor device manufacturing method according to claim 1, further comprising, before the first step, a step in which the substrate is subject to nitrogen processing.

15. The semiconductor device manufacturing method according to claim 1, further comprising, after the second step, a step in which the metal oxide film is subject to dry etching or wet etching.

16. A semiconductor device manufacturing method comprising:
    a first step of forming a metal film on a substrate in a non-oxidizing atmosphere; and
    a second step of forming a gate insulating film by oxidizing the metal film in an oxidizing atmosphere,
    wherein a thickness of the metal film is substantially equivalent to a range of implantation of the oxygen ions.

17. The semiconductor device manufacturing method according to claim 16, wherein the oxidizing atmosphere in the second step includes oxygen that has been turned into a plasma or oxygen that has been excited by light.

18. The semiconductor device manufacturing method according to claim 16, wherein the first step includes a step of propelling metal particles making up the metal film toward the substrate by setting an energy per particle at not less than 0.05 eV and not more than 1 eV.

19. The semiconductor device manufacturing method according to claim 16, wherein the metal film includes at least one of hafnium, zirconium, titanium, tantalum, aluminum and a lanthanoid.

20. The semiconductor device manufacturing method according to claim 16, further comprising, before the first step, a step of forming a nitride film on the substrate.

21. The semiconductor device manufacturing method according to claim 16, wherein a metal nitride film or a metal oxide film is deposited in place of the metal film in the first step.

22. A semiconductor device manufacturing method comprising:
    a first step of forming a metal film on a substrate in a non-oxidizing atmosphere;
    a second step of forming a gate insulating film by oxidizing the metal film in an oxidizing atmosphere; and
    a third step of heating the substrate having the gate insulating film in an inert gas or under a vacuum.

23. The semiconductor device manufacturing method according to claim 22, wherein the third step includes a step of maintaining the temperature of the substrate at not less than 0° C. and not more than 600° C.

24. The semiconductor device manufacturing method according to claim 22, wherein the metal film includes at least one of hafnium, zirconium, titanium, tantalum, aluminum and a lanthanoid.

25. The semiconductor device manufacturing method according to claim 22, wherein a metal nitride film or a metal oxide film is deposited in place of the metal film in the first step.

26. A semiconductor device manufacturing method comprising:
    a first step of depositing a metal film on a substrate in a non-oxidizing atmosphere; and
    a second step of forming a metal oxide film by oxidizing the metal film in an oxidizing atmosphere,
    wherein a thickness of an interface layer formed between the substrate and the metal oxide film is 1.7 nm or less, after the second step.

27. A semiconductor device manufacturing method comprising:
    a first step of depositing a metal film on a substrate in a non-oxidizing atmosphere; and
    a second step of forming a metal oxide film by oxidizing the metal film in an oxidizing atmosphere,
    wherein a thickness of an interface layer formed between the substrate and the metal oxide film is smaller than a thickness of the metal oxide film, after the second step.

28. A semiconductor device manufacturing method comprising:
    a first step of depositing a metal film on a substrate in a non-oxidizing atmosphere; and
    a second step of forming a metal oxide film by oxidizing the metal film in an oxidizing atmosphere,
    wherein in the second step, the oxidizing atmosphere includes oxygen that has been excited by light.

29. A semiconductor device manufacturing method comprising:
    a first step of depositing a metal film on a substrate in a non-oxidizing atmosphere; and
    a second step of forming a metal oxide film by oxidizing the metal film in an oxidizing atmosphere,
    wherein in the second step, an ion implantation system, an ion source or a plasma generating system is used.

* * * * *

UNITED STATES PATENT AND TRADEMARK OFFICE
CERTIFICATE OF CORRECTION

| | |
|---|---|
| PATENT NO. | : 7,115,533 B2 |
| APPLICATION NO. | : 10/319654 |
| DATED | : October 3, 2006 |
| INVENTOR(S) | : Shigenori Hayashi et al. |

It is certified that error appears in the above-identified patent and that said Letters Patent is hereby corrected as shown below:

On the title page of the Letter Patent,

Under section '(56) Reference Cited, U.S. PATENT DOCUMENTS", add -- US 4,464,701  8/1984  Roberts et al. --

Signed and Sealed this

First Day of May, 2007

JON W. DUDAS
*Director of the United States Patent and Trademark Office*